(12) United States Patent
Chen

(10) Patent No.: US 7,772,488 B2
(45) Date of Patent: Aug. 10, 2010

(54) CASE ASSEMBLY STRUCTURE AND ELECTRONIC DEVICE WITH SAME

(75) Inventor: Hung-Chuan Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 216 days.

(21) Appl. No.: 12/181,503

(22) Filed: Jul. 29, 2008

(65) Prior Publication Data
US 2009/0294171 A1    Dec. 3, 2009

(30) Foreign Application Priority Data
May 29, 2008    (TW) .............................. 97120006 A

(51) Int. Cl.
H01B 9/06    (2006.01)
H05K 7/20    (2006.01)

(52) U.S. Cl. .................. 174/16.1; 174/520; 361/695
(58) Field of Classification Search ................ 174/16.1, 174/520; 361/695; 454/184
See application file for complete search history.

(56) References Cited
U.S. PATENT DOCUMENTS

| | | | |
|---|---|---|---|
| 7,304,843 B2 * | 12/2007 | Peng et al. ............. | 361/679.48 |
| 7,342,785 B2 * | 3/2008 | Liu ............................ | 361/695 |
| 7,349,211 B2 * | 3/2008 | Chen et al. ................. | 361/695 |
| 7,414,841 B2 * | 8/2008 | Chen et al. ................. | 361/697 |
| 7,440,277 B2 * | 10/2008 | Musgrave et al. .......... | 361/695 |
| 7,443,674 B1 * | 10/2008 | Hanlon ....................... | 361/695 |
| 7,447,020 B2 * | 11/2008 | Xia et al. .................... | 361/695 |
| 7,492,590 B2 * | 2/2009 | Chen et al. ................. | 361/695 |
| 7,494,408 B2 * | 2/2009 | Chen et al. ................. | 454/184 |
| 7,616,441 B2 * | 11/2009 | Horng ........................ | 361/697 |
| 7,633,755 B2 * | 12/2009 | Zhou et al. ................. | 361/697 |
| 7,639,496 B2 * | 12/2009 | Lv et al. ..................... | 361/695 |
| 7,672,126 B2 * | 3/2010 | Yeh et al. ................... | 361/695 |

* cited by examiner

*Primary Examiner*—Hung V Ngo
(74) *Attorney, Agent, or Firm*—Kirton & McConkie; Evan R. Witt

(57) ABSTRACT

The present invention provides a case assembly structure of an electronic device. The case assembly structure includes a first case, a second case and a heat-dissipating element. The first case has an engaging hole and a first opening. The second case has an engaging element engaged with the engaging hole of the first case and a second opening aligned with the first opening of the first case. The heat-dissipating element includes a fastening hole aligned with the first opening of the first case and the second opening of the second case. The first case, the second case and the heat-dissipating element are combined together by penetrating a fastening element through the first opening, the second opening and the fastening hole.

20 Claims, 9 Drawing Sheets

CASE ASSEMBLY STRUCTURE AND ELECTRONIC DEVICE WITH SAME

FIELD OF THE INVENTION

The present invention relates to a case assembly structure and an electronic device having such a case assembly structure, and more particularly to a case assembly structure and a power supply apparatus having such a case assembly structure.

BACKGROUND OF THE INVENTION

In our daily lives, various electronic devices such as power adapters, transformers, power supply apparatuses, electrical connectors and the like are widely used. Since the internal electronic components and the circuits of these electronic devices need to be appropriately isolated and protected, these electronic devices are usually covered by a case assembly structure to avoid the contact with the external environment.

Take a power supply apparatus for example. FIG. 1 is a schematic exploded view illustrating a case assembly structure of a conventional power supply apparatus. As shown in FIG. 1, the case assembly structure 10 of the power supply apparatus 1 comprises a first case 11 and a second case 12. The second case 12 has an extension part 121 extended from an edge thereof. Several bolt holes 122 are formed in the extension part 121 of the second case 12. Corresponding to the bolt holes 122, the first case 11 has several bolt holes 111. By penetrating screws 13 through corresponding bolt holes 111 and 122, the first case 11 is combined with the second case 12. Furthermore, the power supply apparatus 1 further has a heat-dissipating element 14 (e.g. a fan) for removing heat generated during operation. The heat-dissipating element 14 has several bolt holes 141. Corresponding to the bolt holes 141, the first case 11 has several bolt holes 112. By penetrating screws 13 through corresponding bolt holes 112 and 141, the heat-dissipating element 14 is fastened on the first case 11.

Since the first case 11 of the case assembly structure 10 of the power supply apparatus 1 has two sets of bolt holes 111 and 112 matching the bolt holes of the second case 12 and the heat-dissipating element 14, the process of fabricating the first case 11 is relatively complicated. For assembling the case assembly structure 10, the bolt holes 111 and 112 of the first case 11 need to be respectively aligned with the bolt holes 122 of the second case 12 and bolt holes 141 of the heat-dissipating element 14. If one or more of the bolt holes 111 and 112 are not precisely aligned with the bolt holes 122 and 141, the case assembly structure 10 fails to be successfully combined together because one or more screws 13 cannot be screwed in corresponding bolt holes. Moreover, the processing of assembling the case assembly structure 10 is not cost-effective because a great amount of screws 13 are required.

SUMMARY OF THE INVENTION

An object of the present invention is to provide a case assembly structure and an electronic device having such a case assembly structure so as to obviate the drawbacks encountered by the prior art.

In accordance with an aspect of the present invention, there is provided a case assembly structure of an electronic device. The case assembly structure includes a first case, a second case and a heat-dissipating element. The first case has an engaging hole and a first opening. The second case has an engaging element engaged with the engaging hole of the first case and a second opening aligned with the first opening of the first case. The heat-dissipating element includes a fastening hole aligned with the first opening of the first case and the second opening of the second case. The first case, the second case and the heat-dissipating element are combined together by penetrating a fastening element through the first opening, the second opening and the fastening hole.

In accordance with another aspect of the present invention, there is provided an electronic device. The electronic device comprises a case assembly structure and a circuit board assembly. The circuit board assembly is accommodated within the case assembly structure. The case assembly structure includes a first case, a second case and a heat-dissipating element. The first case has an engaging hole and a first opening. The second case has an engaging element engaged with the engaging hole of the first case and a second opening aligned with the first opening of the first case. The heat-dissipating element includes a fastening hole aligned with the first opening of the first case and the second opening of the second case. The first case, the second case and the heat-dissipating element are combined together by penetrating a fastening element through the first opening, the second opening and the fastening hole.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
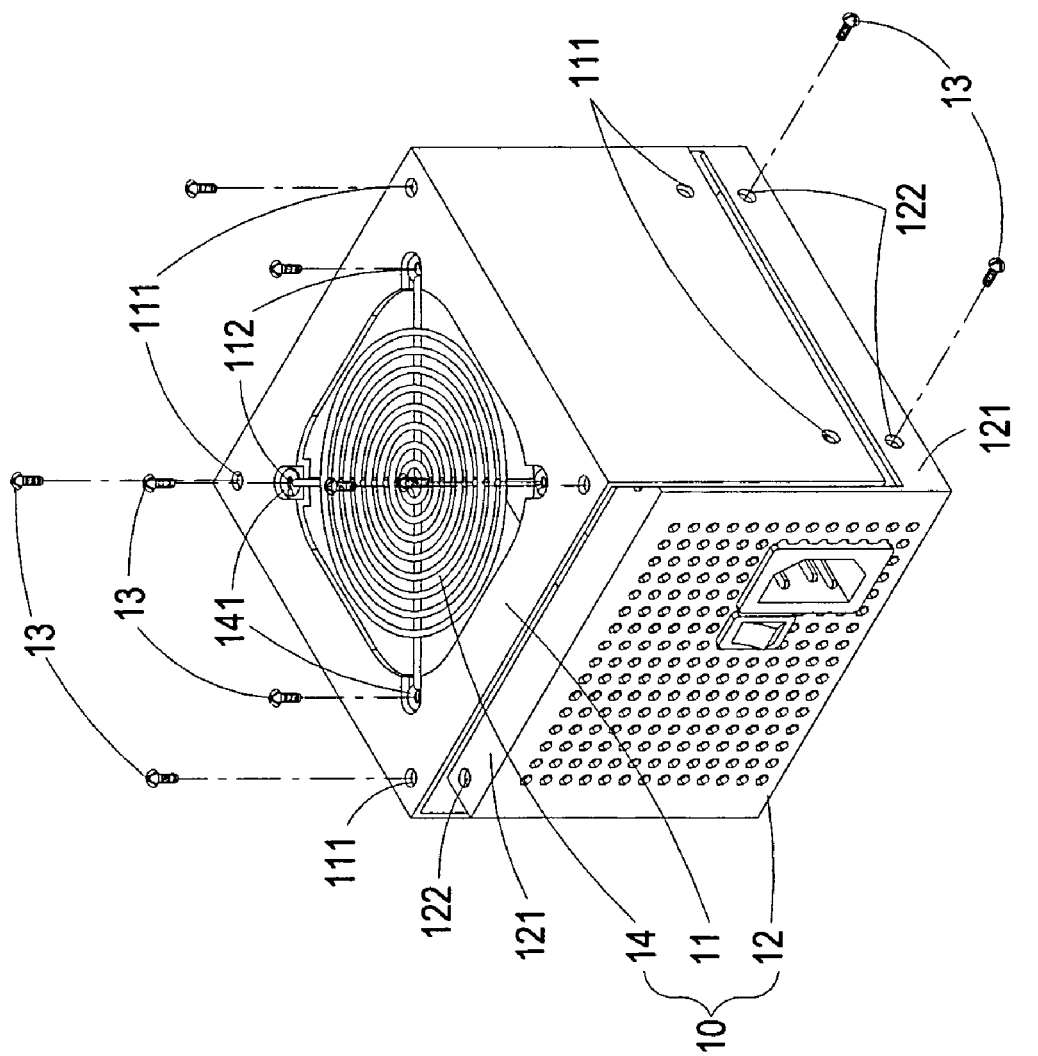
FIG. 1 is a schematic exploded view illustrating a case assembly structure of a conventional power supply apparatus.
Figure 2A:
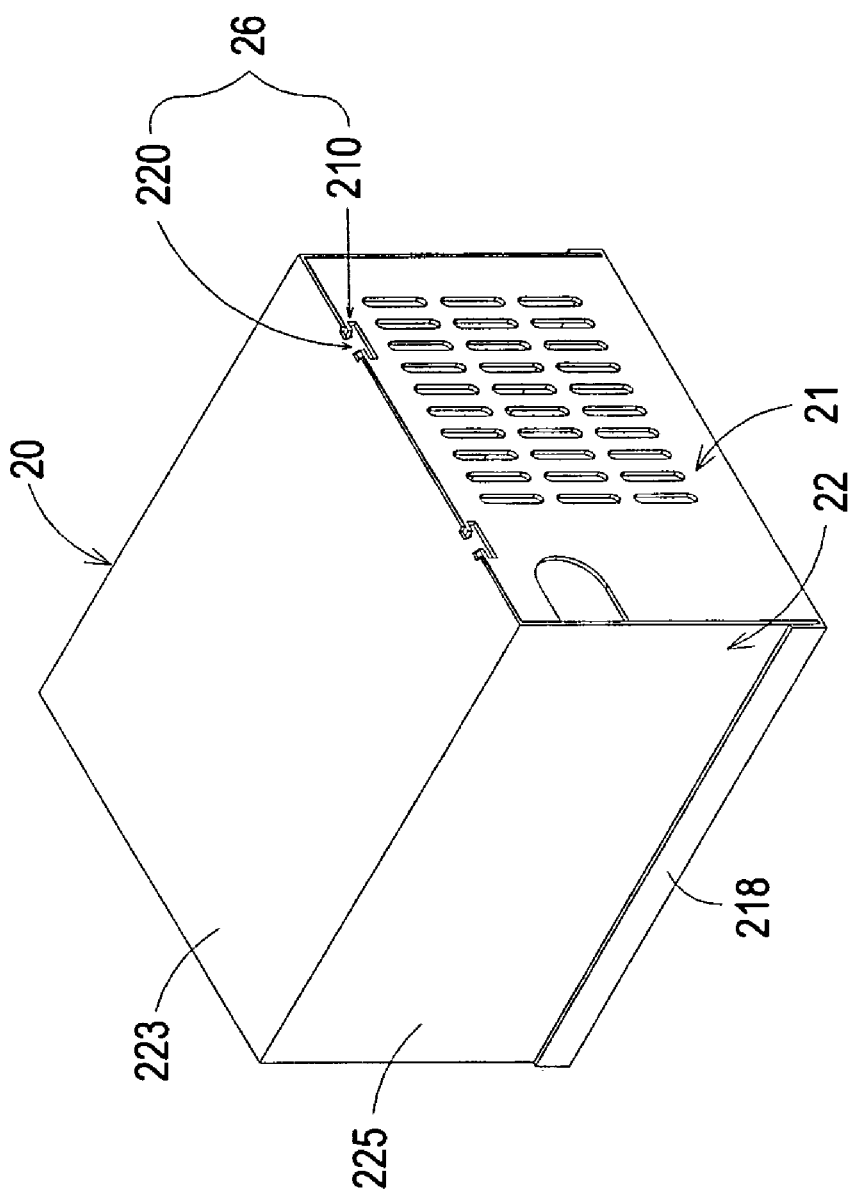
FIGS. 2A and 2B are schematic perspective views of an electronic device taken from different viewpoints according to a first preferred embodiment of the present invention.
Figure 2B:
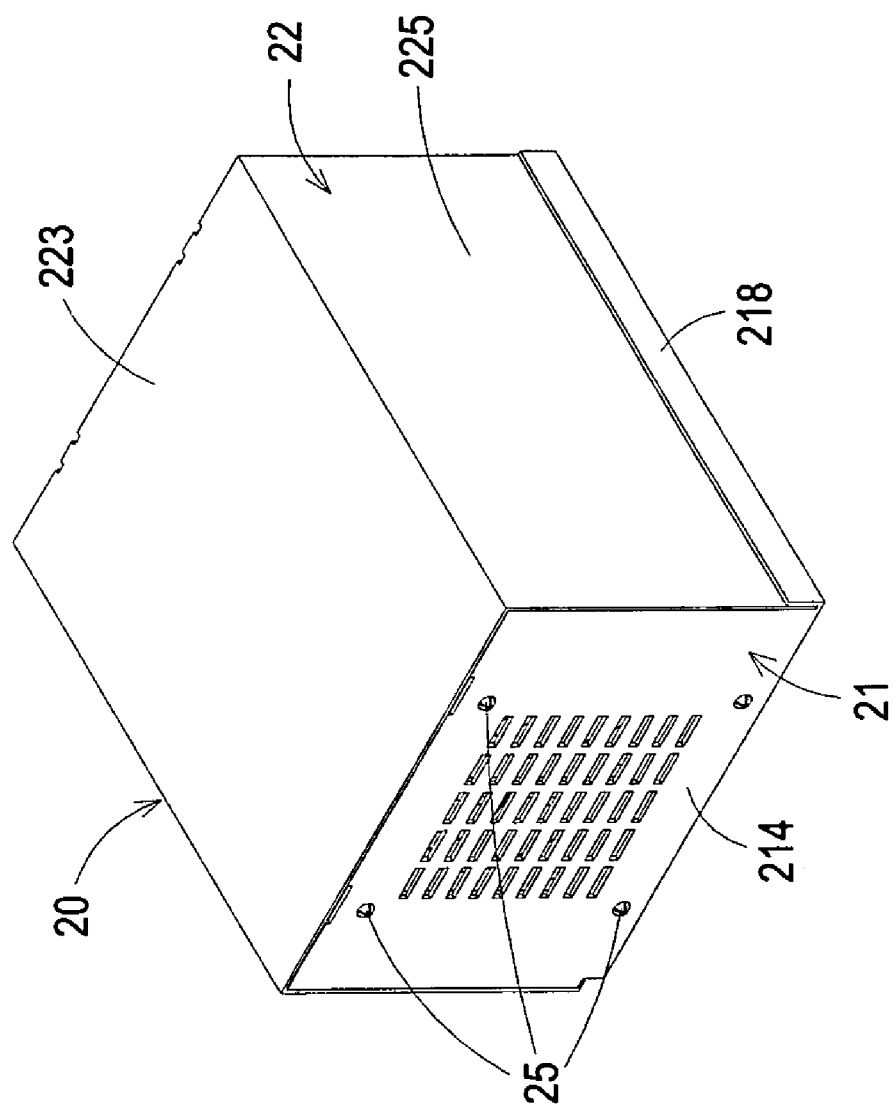
Figure 3:
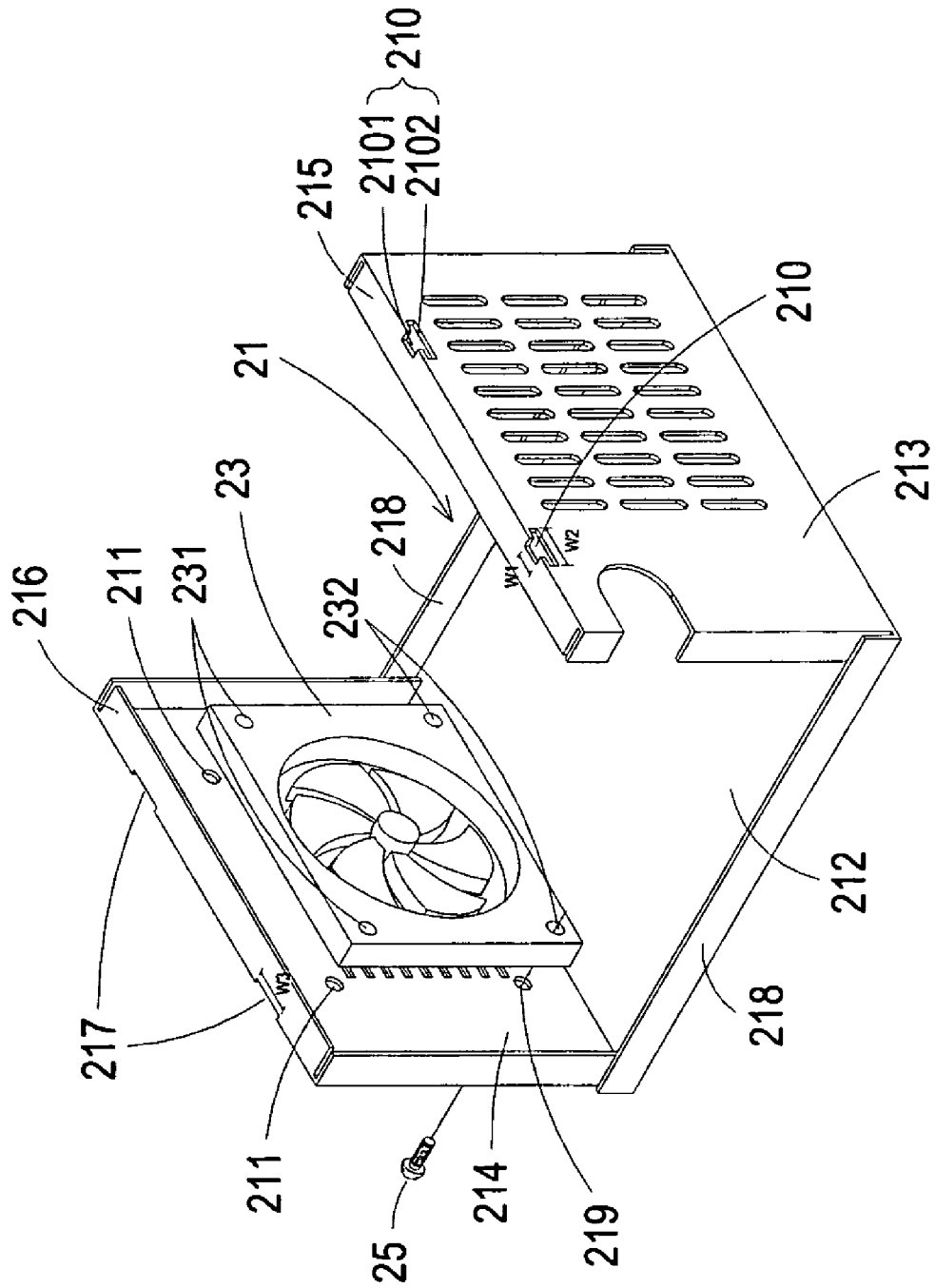
FIG. 3 is a schematic perspective view illustrating the first case and the heat-dissipating element of the case assembly structure of the electronic device shown in FIG. 2.
Figure 5:
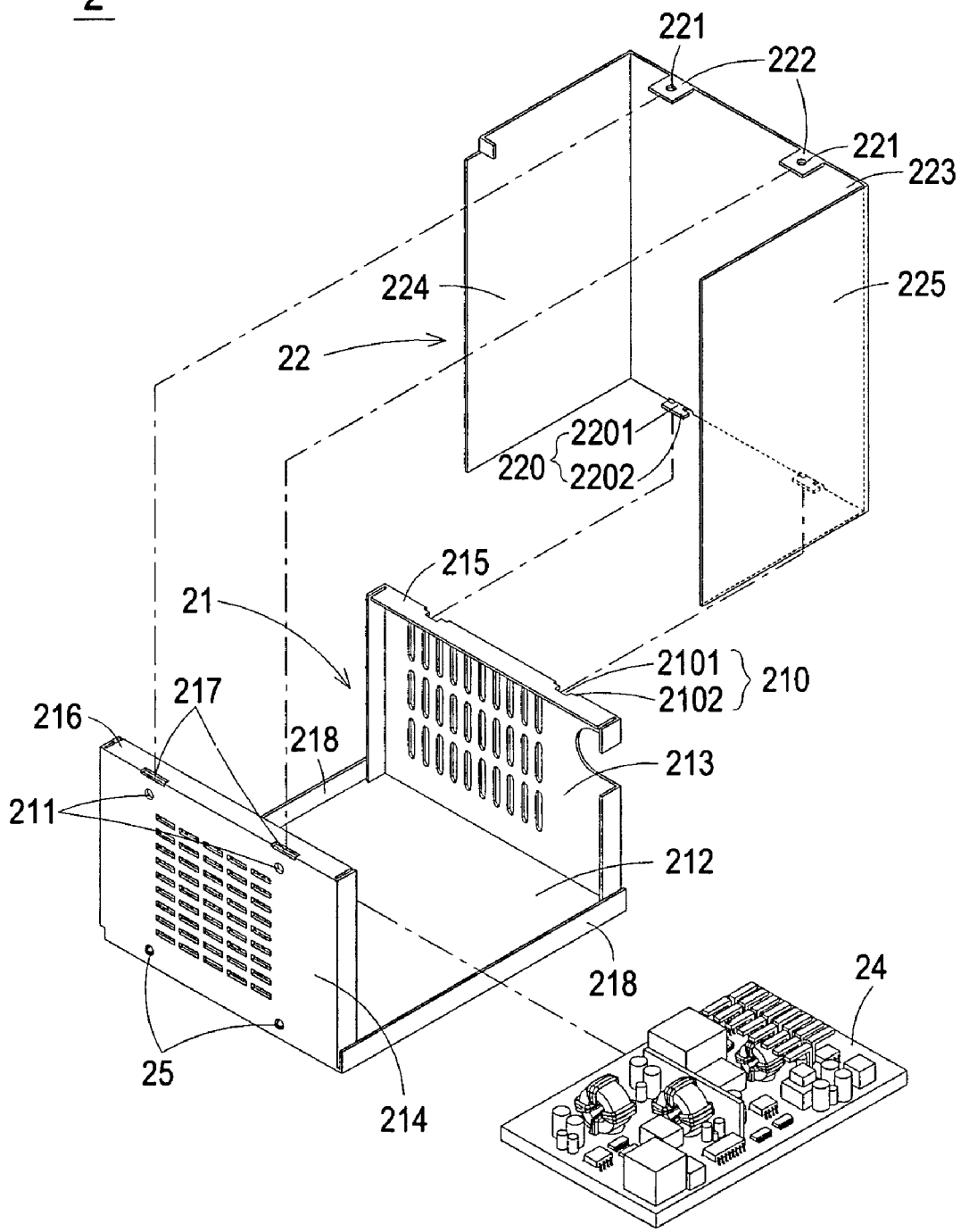
FIG. 5 is a schematic exploded view of the electronic device shown in FIG. 2.

FIGS. 2A and 2B are schematic perspective views of an electronic device taken from different viewpoints according to a first preferred embodiment of the present invention. An example of the electronic device 2 includes but is not limited to a power supply apparatus. The power supply apparatus may be disposed with a host computer to provide electrical energy for powering the computer system. The electronic device 2 comprises a case assembly structure 20 and a circuit board assembly 24 (as shown in FIG. 5). The circuit board assembly 24 is disposed within the case assembly structure 20. The case assembly structure 20 is substantially a rectangular solid structure. Preferably, the case assembly structure 20 is made of metallic material. The case assembly structure 20 principally comprises a first case 21, a second case 22 and a heat-dissipating element 23 (as shown in FIG. 3). When the first case 21 and the second case 22 are combined together, a receptacle is defined between the first case 21 and the second case 22 for accommodating the circuit board assembly 24 therein. The heat-dissipating element 23 is for example a fan for facilitating removing heat generated from the circuit board assembly 24 during operation.

FIG. 3 is a schematic perspective view illustrating the first case and the heat-dissipating element of the case assembly structure of the electronic device shown in FIG. 2. As shown in FIG. 3, the first case 21 of the case assembly structure 20 comprises a horizontal plate 212, a first side plate 213 and a second side plate 214, which are all rectangular plates. Preferably, the horizontal plate 212, the first side plate 213 and the second side plate 214 are integrally formed. The first side plate 213 and the second side plate 214 have substantially identical dimensions and arranged on opposite sides of the horizontal plate 212. In this embodiment, the first side plate 213 and the second side plate 214 are perpendicular to the horizontal plate 212 such that the first case has a U-shaped cross-section. In addition, the first case 21 has a first extension plate 215 and a second extension plate 216, which are internally and vertically extended from the upper edges of the first side plate 213 and the second side plate 214, respectively. In other words, the first extension plate 215 and the second extension plate 216 are substantially parallel with the horizontal plate 212. In some embodiments, several engaging holes 210 are formed in the border between the first side plate 213 and the first extension plate 215.

Please refer to FIG. 3 again. The first case 21 has two engaging holes 210. It is of course that the number of engaging holes 210 may be varied as required. Each engaging hole 210 includes a first section 2101 and a second section 2102. The first section 2101 is disposed in the first extension plate 215 and the second section 2102 is formed in the first side plate 213. The first section 2101 is communicated with the second section 2102. For each engaging hole 210, the width w2 of the second section 2102 is greater than the width w1 of the first section 2101.

Figure 6:
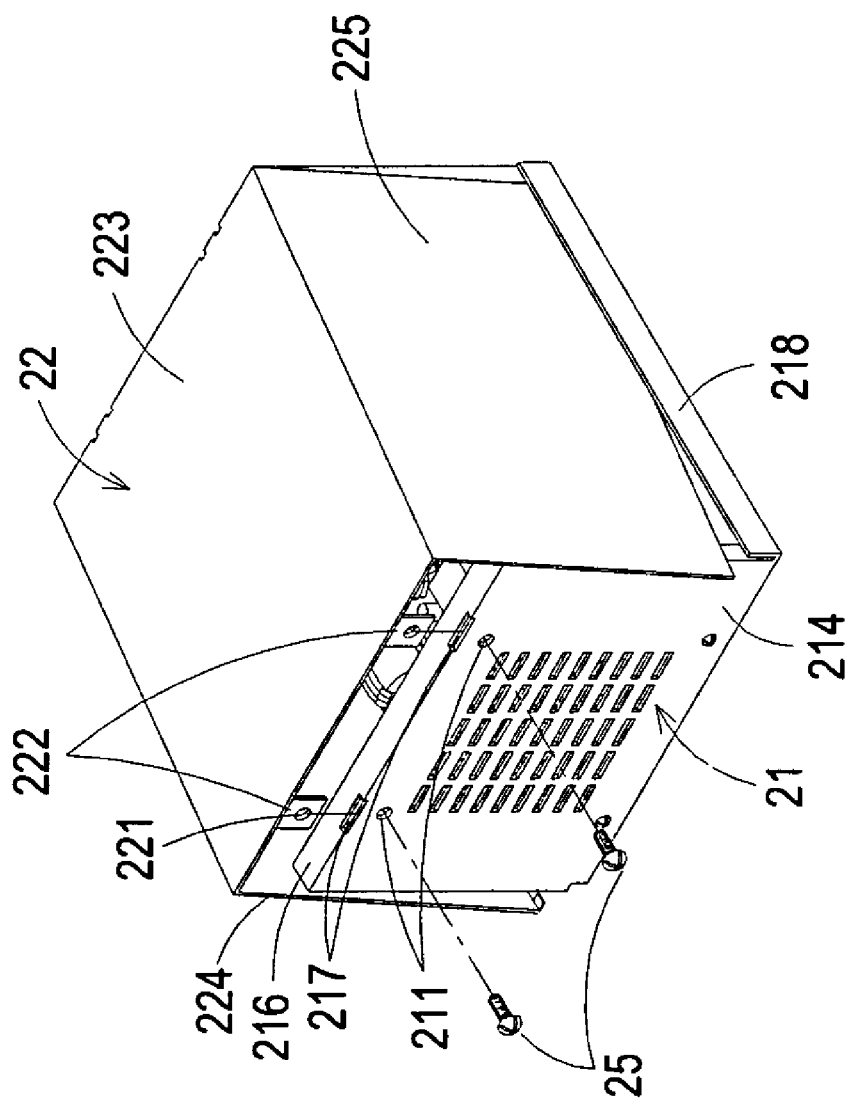
FIG. 6 is a schematic assembled view of the electronic device of FIG. 5.

The heat-dissipating element 23 has several fastening holes 231. Corresponding to the fastening holes 231, the first case 21 has several first openings 211 formed in the second side plate 214. By penetrating fastening elements 25 (e.g. screws or rivets) through corresponding first openings 211 and 231, the heat-dissipating element 23 is fastened on the second side plate 214 of the first case 21 (as also shown in FIGS. 2B and 6). In this embodiment, the number of fastening holes 231 is two and these fastening holes 231 are arranged in the vicinity of the second extension plate 216. In some embodiments, the heat-dissipating element 23 further comprises initial fixing holes 232. Corresponding to the initial fixing holes 232, the second side plate 214 of the first case 21 has initial fixing holes 219. By penetrating corresponding fastening elements 25 through the initial fixing holes 219 and 232, the heat-dissipating element 23 is initially fixing on the second side plate 214 of the first case 21 (as shown in FIGS. 5 and 6). Meanwhile, the fastening holes 231 of the heat-dissipating element 23 and the first openings 211 are aligned with each other.

Please refer to FIG. 3 again. The first case 21 has several retaining holes 217 formed in the second extension plate 216 of the second case 22. The number of retaining holes 217 is equal to that of the first openings 211 formed in the second side plate 214. The locations of the retaining holes 217 face the first openings 211. Each retaining hole 217 has a width w3. Furthermore, the first case 21 has two third extension parts 218 extended from bilateral sides of the horizontal plate 212 and located between the first side plate 213 and the second site plate 214. It is preferred that the third extension parts 218 are spaced from the first side plate 213 and the second site plate 214 by respective gaps. For assembling the first case 21 with the second case 22, portions of the second case 22 may be inserted into the gaps and thus sheltered by the third extension parts 218 (as shown in FIGS. 3A, 3B and 6).

Figure 4:
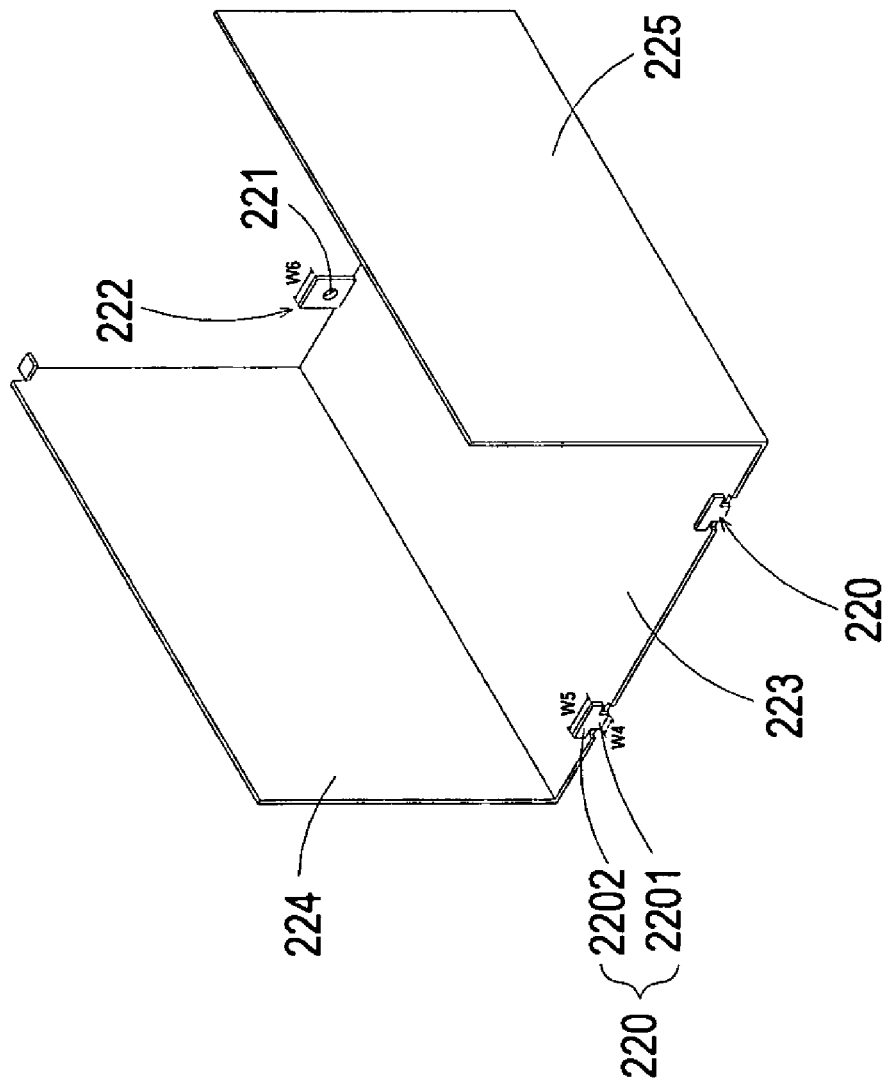
FIG. 4 is a schematic perspective view illustrating the second case of the case assembly structure of the electronic device shown in FIG. 2.

FIG. 4 is a schematic perspective view illustrating the second case of the case assembly structure of the electronic device shown in FIG. 2. The second case 22 of the case assembly structure 20 of the electronic device 2 principally comprises several engaging elements 220 and several second openings 221. The locations of the engaging elements 220 and the second openings 221 of the second case 22 correspond to those of the engaging holes 210 and the first openings 211 of the first case 21, respectively. In this embodiment, the second case 22 has ear parts 222 protruded from an edge of thereof, and the second openings 221 are formed in ear parts 222 of the second case 22. Furthermore, the second case 22 comprises a horizontal plate 223, a first side plate 224 and a second side plate 225, which are all rectangular plates. Preferably, the horizontal plate 223, the first side plate 224 and the second side plate 225 are integrally formed. The horizontal plate 223 has substantially the same dimension as the horizontal plate 212 of the first case 21. The first side plate 224 and the second side plate 225 have substantially identical dimensions and arranged on opposite sides of the horizontal plate 223. The horizontal plate 223, the first side plate 224 and the second side plate 225 have identical length. The widths of the first side plate 224 and the second side plate 225 are substantially identical to those of the first side plate 213 and the second side plate 214 of the second case 22. Consequently, when the first case 21 is combined with the second case 22, a rectangular solid case assembly structure 20 is formed.

Please refer to FIG. 4 again. The engaging elements 220 are vertically protruded from an edge of the horizontal plate 223, which is between the first side plate 224 and the second side plate 225. The ear parts 222 are vertically protruded from another edge of the horizontal plate 223. In other words, the engaging elements 220 and the ear parts 222 are vertically protruded from opposite edges of the horizontal plate 223. Preferably, the engaging elements 220 and the ear parts 222 are integrally formed with the horizontal plate 22. The locations of the engaging elements 220 of the second case 22 correspond to the engaging holes 210 of the first case 21. The number of engaging elements 220 is equal to that of the engaging holes 210. In this embodiment, the second case 22 has two engaging elements 220. It is of course that the number of engaging elements 220 may be varied as required. Each engaging element 220 includes a first engaging part 2201 and a second engaging part 2202. The first engaging part 2201 has a first end connected to the horizontal plate 223 and a second end connected to the second engaging part 2202. For each engaging element 220, the width w5 of the second engaging part 2202 is greater than the width of the width w4 of the first engaging part 2201. In addition, the width w5 of the second engaging part 2202 is slightly smaller than the width w2 of the second section 2102 of the engaging hole 210 but greater than the width w1 of the first section 2101 of the engaging hole 210. The width w4 of the first engaging part 2201 is slightly smaller than the width w1 of the first section 2101 of the engaging hole 210. When the engaging elements 220 of the second case 22 are engaged with the engaging holes 210 of the first case 21, a pivotal mechanism 26 is collectively defined by the engaging elements 220 and the engaging holes 210 (as shown in FIG. 2A). Furthermore, the locations of the ear parts 222 correspond to those of the retaining holes 217 of the first case 21. The width of the ear part 222 is slightly smaller than the width w3 of the retaining hole 217. The ear parts 222 are inserted into corresponding retaining holes 217 for facilitating alignment of the second openings 221 with the first openings 211 (as shown in FIG. 6).

FIG. 5 is a schematic exploded view of the electronic device shown in FIG. 2. FIG. 6 is a schematic assembled view of the electronic device of FIG. 5. Hereinafter, a process of assembling the electronic device will be illustrated in more details with reference to FIGS. 5, 6, 2A and 2B. First of all, by penetrating fastening elements 25 through corresponding initial fixing holes 219 and 232, the heat-dissipating element 23 is initially fixing on the first case 21. Next, the fastening holes 231 of the heat-dissipating element 23 are aligned with the first openings 211 of the first case 21 (as shown in FIG. 3). Next, the circuit board assembly 24 is accommodated with the receptacle defined by the horizontal plate 212, the first side plate 213 and the second side plate 214. Next, the engaging elements 220 are inserted into corresponding engaging holes 210 of the first case 21. Since the width w5 of the second engaging part 2202 is greater than the width of the width w4 of the first engaging part 2201 but slightly smaller than the width w2 of the second section 2102 of the engaging hole 210, the engaging elements 220 are inserted into corresponding engaging holes 210 through the second section 2102 of the engaging hole 210. In addition, since the width w1 of the first section 2101 of the engaging hole 210 is smaller than width w5 of the second engaging part 2202 but greater than the width w4 of the first engaging part 2201, the first engaging part 2201 of the engaging element 220 is partially received in the first section 2101 of the engaging hole 210 and the second engaging part 2202 of the engaging element 220 is sustained against the periphery of the first section 2101 of the engaging hole 210 (i.e. the first extension 215). Meanwhile, the pivotal mechanism 26 is collectively defined by the engaging elements 220 and the engaging holes 210. In other words, the second case 22 is pivoted with respect to the first case 21 by using the pivotal mechanism as the rotating shaft. During rotation of the second case 22, a force is generated to pull the engaging elements 220 toward the first sections 2101 of the engaging holes 210 such that the engaging elements 220 are firmly engaged with the engaging holes 210. In addition, the second engaging parts 2202 of the engaging elements 220 are sustained against the first extension 215 in order to prevent detachment of the second case 22 from the first case 21 during rotation of the second case 22.

When the second case 22 is pivotal about the pivotal mechanism 26 and approaches the first case 21 (as shown in FIG. 6), the first side plate 224 and the second side plate 225 are inserted into the gaps between the third extension parts 218 and the first side plate 213/the second site plate 214. In addition, the ear pars 222 of the second case 22 are inserted into the retaining holes 217 of the second extension part 216 of the first case 21. Until the receptacle defined by the horizontal plate 212, the first side plate 213 and the second side plate 214 of the first case 21 is completely sheltered by the second case 22, the horizontal plate 223 are in contact with the first extension part 215 and the second extension part 216 of the first case 21. As a consequence, the horizontal plate 223 of the second case 22 and the horizontal plate 212 of the first case 21 define the top surface and the bottom surface of the case assembly structure 20, respectively. In addition, the first side plate 224 and the second side plate 225 of the second case 22 and the first side plate 213 and the second site plate 214 of the first case 21 define four sidewalls of the case assembly structure 20. Moreover, since the peripheries of the first side plate 224 and the second side plate 225 of the second case 22 are partially sheltered by the third extension parts 218 of the first case 21, the first case 21 and second case 22 are tightly combined with each other.

After the ear parts 222 of the second case 22 are inserted into corresponding retaining holes 217 of the first case 21, the ear parts 222 are located between the second side plate 214 of the first case 21 and the heat-dissipating element 23, and the second openings 221 are aligned with the first openings 211 of the first case 21 and the fastening holes 231 of the heat-dissipating element 23. By successively penetrating corresponding fastening elements 25 (e.g. screws) through the first openings 211 of the first case 21, the second openings 221 of the second case 22 and the fastening holes 231 of the heat-dissipating element 23, the first case 21, the second case 22 and the heat-dissipating element 23 are combined together so as to implement the case assembly structure 20 (as is shown in FIG. 2A). Since the circuit board assembly 24 is accommodated with the receptacle inside the case assembly structure 20, the electronic device 2 of the first preferred embodiment is also assembled.

In the above embodiments, the engaging elements 220 of the second case 22 are engaged with the engaging holes 210 of the first case 21. By successively penetrating corresponding fastening elements 25 through the first openings 211, the second openings 221 and the fastening holes 231, the first case 21, the second case 22 and the heat-dissipating element 23 are combined together so as to implement the case assembly structure 20. In comparison with the prior art, the process of fabricating the case assembly structure 20 uses less amount of fastening elements 25.

Figure 7A:
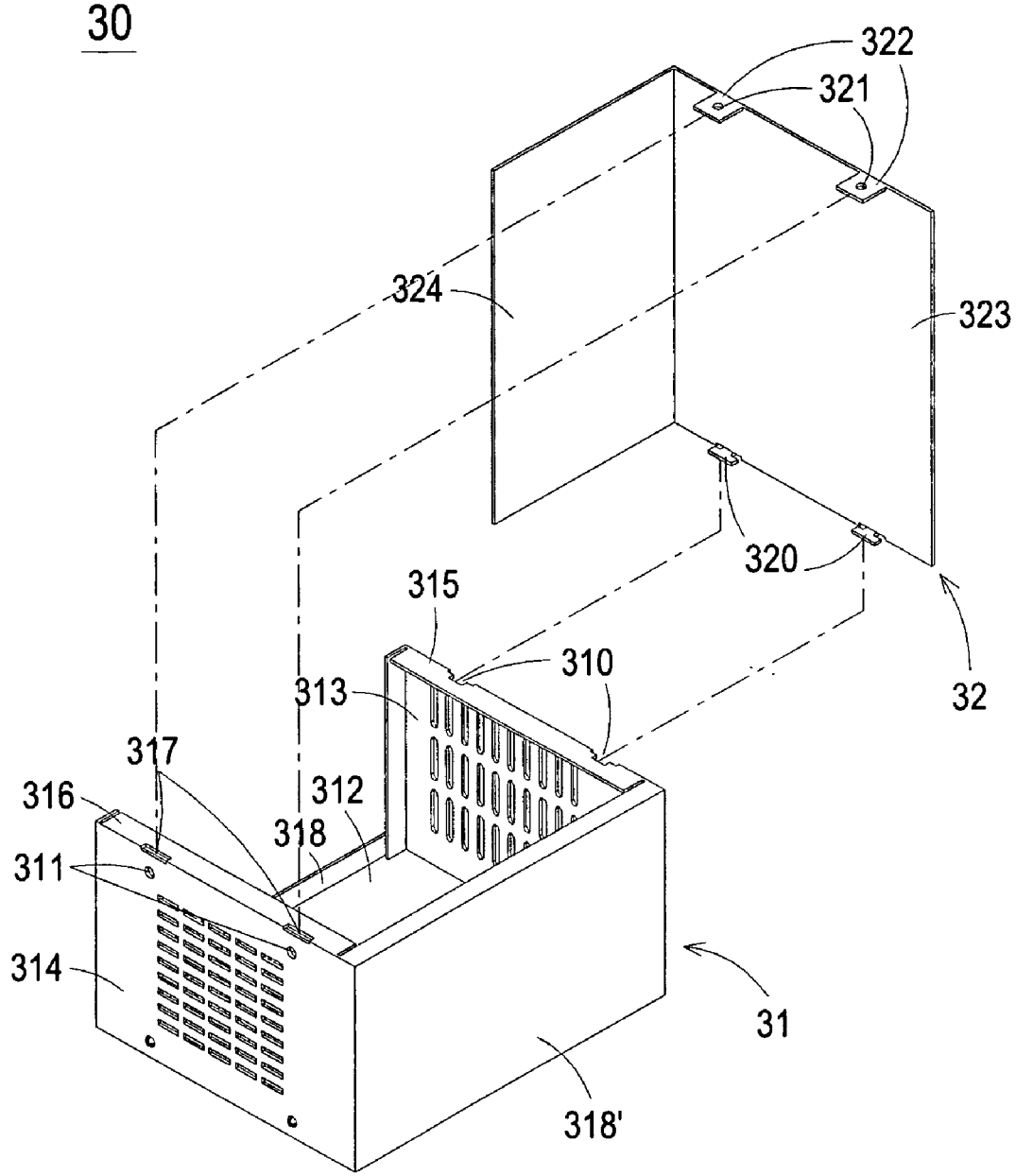
FIG. 7A is a schematic perspective view illustrating a case assembly structure of the electronic device according to a second preferred embodiment of the present invention.

FIG. 7A is a schematic perspective view illustrating a case assembly structure of the electronic device according to a second preferred embodiment of the present invention. The case assembly structure 30 comprises a first case 31, a second case 32 and a heat-dissipating element (not shown). Likewise, the heat-dissipating element is attached on the inner side of the first case 31. The engaging holes 310, the first openings 311, the horizontal plate 312, the first side plate 313, the second side plate 314, the first extension part 315, the second extension part 316 and the retaining holes 317 included in the first case 31 of FIG. 7A are identical to those shown in FIG. 3, and are not redundantly described herein. The engaging elements 320, the second openings 321, the ear parts 322, the horizontal part 323 and the first side plate 324 included in the second case 32 of FIG. 7A are identical to those shown in FIG. 4, and are not redundantly described herein. In this embodiment, a third extension part 318 is protruded from an edge of the horizontal plate 312 of the first case 31 but a third side plate 318' is protruded from an opposite edge of the horizontal plate 312 of the first case 31. Since the first case 31 includes three side plates 313, 314 and 318', the second case 32 needs only one side plate (i.e. 324). The first case 31, the second case 32 and the heat-dissipating element are combined together so as to implement the case assembly structure 30. The connecting mechanisms between the first case 31, the second case 32 and the heat-dissipating element are similar to those shown in the first preferred embodiment, and are not redundantly described herein.

Figure 7B:
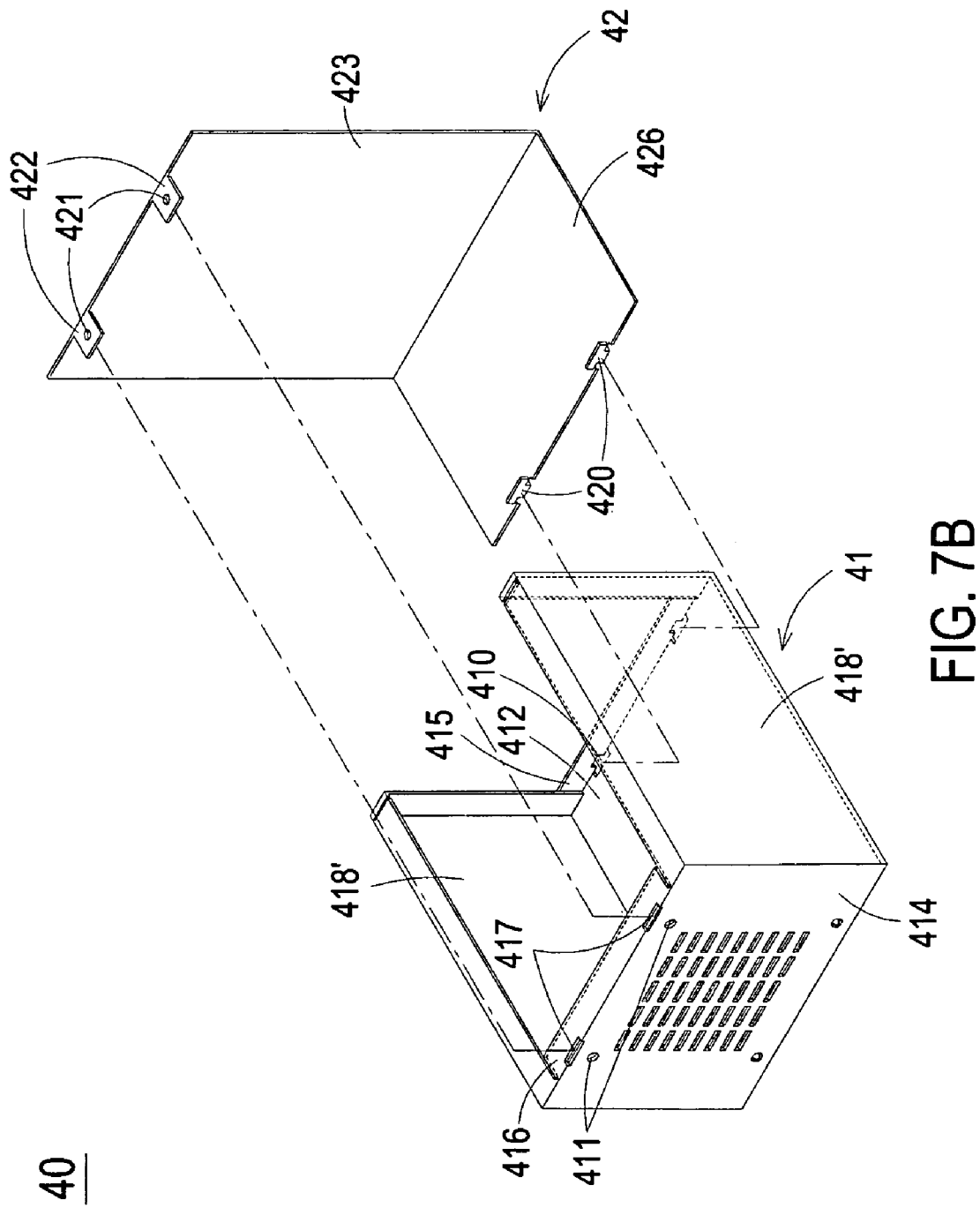
FIG. 7B is a schematic perspective view illustrating a case assembly structure of the electronic device according to a third preferred embodiment of the present invention.

FIG. 7B is a schematic perspective view illustrating a case assembly structure of the electronic device according to a third preferred embodiment of the present invention. The case assembly structure 40 comprises a first case 41, a second case 42 and a heat-dissipating element (not shown). Likewise, the heat-dissipating element is attached on the inner side of the first case 41. The first openings 411, the horizontal plate 412, the second side plate 414, the second extension part 416 and the retaining holes 417 included in the first case 41 of FIG. 7B are identical to those shown in FIG. 5, and are not redundantly described herein. On the other hand, the first side wall is omitted but a first extension part 415 is vertically protruded from an edge of the horizontal plate 412. The engaging holes 410 are formed in the border between the first extension part 415 and the horizontal plate 412. In addition, the third extension parts 218 of FIG. 5 are replaced by two side plates 418' in this embodiment. Since the first case 41 includes three side plates 414 and 418', the second case 42 needs only one side plate. In this embodiment, a side plate 426 is vertically protruded from one edge of the horizontal part 423. Corresponding to the engaging holes 410 of the first case 41, the engaging elements 420 of the second case 42 are vertically protruded from another edge of the horizontal part 423. Likewise, the second case 42 has ear parts 422 protruded from an edge of thereof and several second openings 421 are formed in ear parts 422 of the second case 22. When the engaging elements 420 of the second case 42 are engaged with the engaging holes 410 of the first case 41, a pivotal mechanism is collectively defined by the engaging elements 420 and the engaging holes 410.

Alternatively, the first openings 410 of the first case 41 may be formed in the second extension part 416. In this circumstance, the locations of the fastening holes of the heat-dissipating element corresponds to the first openings 410 and the second openings 412 of the second case 42 are directly formed in the horizontal plate 423 (e.g. the ear parts 422 are omitted) corresponding to the first openings 411. By successively penetrating corresponding fastening elements through the first openings 411, the second openings 421 and the fastening holes, the first case 41, the second case 42 and the heat-dissipating element are combined together so as to implement the case assembly structure 40.

In the above embodiments, the case assembly structure of the present invention is substantially a rectangular solid structure. Nevertheless, the case assembly structure of the present invention may have an arbitrary shape such as a triangular or polygonal solid structure. In accordance with the present invention, when the engaging elements of the second case are engaged with the engaging holes of the first case, a pivotal mechanism is collectively defined by the engaging elements and the engaging holes. During rotation of the second case with respect to the first case, a force is generated to pull the engaging elements toward the first sections of the engaging holes such that the engaging elements are firmly engaged with the engaging holes. By successively penetrating corresponding fastening elements through the first openings, the second openings and the fastening holes, the first case, the second case and the heat-dissipating element are combined together so as to implement the case assembly structure.

The fastening elements used in the present invention are not restricted to screws or rivets. The present invention needs less amount of fastening elements to combine the first case, the second case and the heat-dissipating element together and thus the fabricating cost is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A case assembly structure of an electronic device, said case assembly structure comprising:
a first case having an engaging hole and a first opening;
a second case having an engaging element engaged with said engaging hole of said first case and a second opening aligned with said first opening of said first case; and
a heat-dissipating element comprising a fastening hole aligned with said first opening of said first case and said second opening of said second case, wherein said first case, said second case and said heat-dissipating element are combined together by penetrating a fastening element through said first opening, said second opening and said fastening hole.

2. The case assembly structure according to claim 1 further comprising a first extension part and a second extension part, which are vertically protruded from two opposite side plates of said first case.

3. The case assembly structure according to claim 2 wherein said engaging hole of said first case is formed in a border between said first case and said first extension plate.

4. The case assembly structure according to claim 3 wherein said engaging hole includes a first section disposed in said first extension plate and a second section disposed in said first case, wherein the width of said second section is greater than that of said first section.

5. The case assembly structure according to claim 4 wherein said engaging element includes a first engaging part and a second engaging part, said first engaging part has a first end connected to said second case and a second end connected to said second engaging part, and the width of said second engaging part is greater than that of said first engaging part.

6. The case assembly structure according to claim 5 wherein said first engaging part of said engaging element is partially received in said first section of said engaging hole, and said second engaging part of said engaging element is sustained against said first extension part, so that a pivotal mechanism is collectively defined by said engaging element and said engaging hole and said second case is pivoted with respect to said first case by using said pivotal mechanism as a rotating shaft.

7. The case assembly structure according to claim 2 wherein said first opening of said first case is in the vicinity of said second extension part, and a retaining hole is formed in said second extension part.

8. The case assembly structure according to claim 7 wherein said second case further comprises an ear part, which is vertically protruded from an edge of said second case and opposed to said engaging element.

9. The case assembly structure according to claim 8 wherein said second opening is formed in said ear part, and said ear part of said second case is inserted into said retaining hole such that said second opening is aligned with said first opening of said first case.

10. The case assembly structure according to claim 1 wherein said electronic device is a power supply apparatus, said heat-dissipating element is a fan, and said fastening element is a screw.

11. An electronic device comprising:
a circuit board assembly; and a case assembly structure accommodating said circuit board assembly therein, and comprising:

a first case having an engaging hole and a first opening;

a second case having an engaging element engaged with said engaging hole of said first case and a second opening aligned with said first opening of said first case; and a heat-dissipating element comprising a fastening hole aligned with said first opening of said first case and said second opening of said second case, wherein said first case, said second case and said heat-dissipating element are combined together by penetrating a fastening element through said first opening, said second opening and said fastening hole.

12. The electronic device according to claim 11 wherein said case assembly structure further comprises a first extension part and a second extension part, which are vertically protruded from two opposite side plates of said first case.

13. The electronic device according to claim 12 wherein said engaging hole of said first case is formed in a border between said first case and said first extension plate.

14. The electronic device according to claim 13 wherein said engaging hole includes a first section disposed in said first extension plate and a second section disposed in said first case, wherein the width of said second section is greater than that of said first section.

15. The electronic device according to claim 14 wherein said engaging element includes a first engaging part and a second engaging part, said first engaging part has a first end connected to said second case and a second end connected to said second engaging part, and the width of said second engaging part is greater than that of said first engaging part.

16. The electronic device according to claim 15 wherein said first engaging part of said engaging element is partially received in said first section of said engaging hole, and said second engaging part of said engaging element is sustained against said first extension part, so that a pivotal mechanism is collectively defined by said engaging element and said engaging hole and said second case is pivoted with respect to said first case by using said pivotal mechanism as a rotating shaft.

17. The electronic device according to claim 12 wherein said first opening of said first case is in the vicinity of said second extension part, and a retaining hole is formed in said second extension part.

18. The electronic device according to claim 17 wherein said second case further comprises an ear part, which is vertically protruded from an edge of said second case and opposed to said engaging element.

19. The electronic device according to claim 18 wherein said second opening is formed in said ear part, and said ear part of said second case is inserted into said retaining hole such that said second opening is aligned with said first opening of said first case.

20. The electronic device according to claim 11 wherein said electronic device is a power supply apparatus, said heat-dissipating element is a fan, and said fastening element is a screw.

* * * * *